United States Patent
Iwase et al.

(10) Patent No.: US 7,225,514 B2
(45) Date of Patent: Jun. 5, 2007

(54) PRODUCTION METHOD OF STACKED PIEZOELECTRIC ELEMENT

(75) Inventors: Akio Iwase, Nishio (JP); Tetsuji Itou, Kariya (JP); Toshio Ooshima, Oobu (JP); Shige Kadotani, Aichi-pref. (JP)

(73) Assignee: Denso Corporation (JP)

( * ) Notice: Subject to any disclaimer, the term of this patent is extended or adjusted under 35 U.S.C. 154(b) by 407 days.

(21) Appl. No.: 10/858,473

(22) Filed: Jun. 2, 2004

(65) Prior Publication Data

US 2004/0255443 A1 Dec. 23, 2004

(30) Foreign Application Priority Data

Jun. 2, 2003 (JP) .............................. 2003-157116

(51) Int. Cl.
*H04R 17/00* (2006.01)
(52) U.S. Cl. ..................... 29/25.35; 29/25.42; 310/328
(58) Field of Classification Search .... 29/25.35–25.42, 29/830–834; 310/328, 366, 311
See application file for complete search history.

(56) References Cited

U.S. PATENT DOCUMENTS

| 4,752,712 | A | * | 6/1988 | Tomita et al. ............... 310/328 |
|---|---|---|---|---|
| 5,245,734 | A | * | 9/1993 | Issartel ....................... 29/25.35 |
| 5,440,794 | A | * | 8/1995 | Kaeriyama et al. ......... 29/25.42 |
| 6,414,417 | B1 | * | 7/2002 | Tsuyoshi et al. ............ 310/366 |
| 6,700,306 | B2 | * | 3/2004 | Nakamura et al. .......... 310/328 |
| 6,757,947 | B2 | * | 7/2004 | Seipler et al. ............. 29/25.35 |
| 2002/0175591 | A1 | * | 11/2002 | Schreiner et al. ........... 310/311 |

FOREIGN PATENT DOCUMENTS

| JP | 05-160458 | 6/1993 |
|---|---|---|
| JP | 07-7193 | 1/1995 |
| JP | 10-290031 | 10/1998 |
| JP | 2001-244514 | 9/2001 |

* cited by examiner

*Primary Examiner*—Minh Trinh
(74) *Attorney, Agent, or Firm*—Nixon & Vanderhye PC

(57) ABSTRACT

A stacked piezoelectric element is produced by alternately stacking a piezoelectric layer and an inner electrode layer. The method includes producing a green sheet 110 for a base, forming a unit body 3 having a narrow stacked part 30 where a narrow piezoelectric material layer 115 having an area smaller than the green sheet 110 for base and an electrode material layer 20 having an area smaller than the green sheet 110 for base are stacked, the unit body being formed by disposing the narrow stacked part 30 on the green sheet 110 for base; forming a stacked body having groove parts by stacking a plurality of the unit bodies 3, the groove part having the bottom being defined by the side face of the narrow stacked part 30; and firing the stacked body.

11 Claims, 18 Drawing Sheets

US 7,225,514 B2

PRODUCTION METHOD OF STACKED PIEZOELECTRIC ELEMENT

This application claims priority to application Ser. No. 2003-157116, filed 02 Jun. 2003. The entire contents of this application is incorporated herein by reference.

FIELD OF THE INVENTION

The present invention relates to a method for producing a stacked piezoelectric element by alternately stacking a piezoelectric layer and an inner electrode layer.

BACKGROUND OF THE INVENTION

Recently, in view of improving the fuel consumption and cleaning the exhaust gas of automobiles, development of injectors capable of more precisely controlling the fuel injection is demanded. As for such a highly precise injector, use of a stacked piezoelectric element as the actuator has been proposed. However, a stacked piezoelectric element having excellent durability and applicable to the actuator of those injectors has not yet been put into practice at present.

The stacked piezoelectric element can be produced, for example, by printing and forming an inner electrode layer of 5 μm on a green sheet having a thickness of about 100 μm, stacking, for example, hundreds of such green sheets, subjecting the stacked green sheets to press-molding, drying, firing, machining and the like to form a stacked body, and joining a side electrode to a side face of the stacked body.

For improving the durability of the stacked piezoelectric element, the inner electrode layer exposed to the side face of the stacked body must be insulated, without fail, so as to prevent the generation of migration or the like.

Japanese Unexamined Patent Publication (Kokai) No. 5-160458 discloses a method of applying an insulating resin coat to the inner electrode exposed to the side face of a stacked body and thereby preventing the migration of silver. However, this method has a problem in that if the resin coat is stripped off, water or the like intrudes to cause migration of silver and insulation failures.

As for the method of insulating the inner electrode layer exposed to the outer peripheral side face of a stacked body, Japanese Unexamined Patent Publication (Kokai) No. 2001-244514 has proposed a method of machining grooves and filling a resin in each groove to achieve insulation by resin. However, it is not practicable, in mass production, to machine grooves having a depth of 500 μm and a height (width) of 50 μm by a cutting saw as disclosed in this patent document.

For example, as described in Patent Publication No. 2001-244514, when grooves are provided on the side face of a stacked body, the insulating resin filled in the groove is stably maintained by an anchor effect and the durability can be improved.

However, machining of grooves by a cutting saw is industrially difficult in view of the working efficiency and, also, the stacked body may be damaged during the machining to cause a problem in quality.

The present invention has been made for solving these problems in conventional techniques and an object of the present invention is to provide a method for producing a stacked piezoelectric element, where grooves can be easily formed on the side face of a stacked body without causing damage.

SUMMARY OF THE INVENTION

The present invention is a method for producing a stacked piezoelectric element by alternately a stacking piezoelectric layer comprising a piezoelectric material and an inner electrode layer comprising an electrically conducting material, the method comprising:

a green sheet production step of producing a green sheet for a base, which constitutes a part of the piezoelectric layer, a unit body formation step of forming a unit body by disposing a narrow stacked part on the green sheet for a base, wherein the narrow stacked part is comprised of a narrow piezoelectric material layer which constitutes a part of the piezoelectric layer and has an area smaller than the green sheet for a base and an electrode material layer, which constitutes the inner electrode layer, having an area smaller than the green sheet for a base, a stacked body formation step of forming a stacked body having groove parts by stacking a plurality of the unit bodies, wherein the groove part having the bottom being defined by the side face of the narrow stacked part, and a firing step of firing the stacked body.

In the present invention, at least the above-described unit body formation step is performed after the green sheet production step. In this unit body formation step, a unit body is formed by disposing the narrow stacked part on the green sheet for a base. The narrow stacked part is constituted, as described above, by stacking a narrow piezoelectric material layer and an electrode material layer each having an area smaller than the green sheet for a base and therefore, the narrow stacked part disposed on the green sheet for a base is in such a state that at least a part of the side face thereof is receding inward from the outer peripheral end face of the green sheet for a base.

As a result, the stacked body obtained by stacking a plurality of unit bodies in the stacked body formation step has a structure where many groove parts receding inward from the outer peripheral end part of the green sheet for a base are present on the side face of the stacked body and the bottom of each groove part is defined by a side face of the narrow stacked part.

The structure of the stacked body having many groove parts is maintained as it is even after the subsequent firing step. At the same time, the green sheet for a base and the narrow piezoelectric material layer are integrated with each other to compose the piezoelectric layer, and the electrode material layer interposed between these piezoelectric layers works out to the inner electrode layer. Accordingly, the stacked piezoelectric element obtained after firing has a structure where the portion having the inner electrode layer is constituted by the narrow stacked part and a groove part is present in the outer periphery thereof.

By virtue of such a structure, in the case of applying coating or the like of an insulating resin material so as to ensure insulation of the inner electrode layer of the stacked piezoelectric element, the insulating resin material intruded into the groove part exerts a so-called anchor effect and the coating state can be more stable than in conventional techniques, whereby the stacked piezoelectric element obtained can be enhanced in durability.

Furthermore, in providing many groove parts on the side face of the stacked piezoelectric element, this can be attained, as described above, by only forming a unit body having a specific structure and stacking the unit bodies, and a specific machining operation conventionally required for forming groove parts, such as cutting work by a cutting saw, is not necessary, so that the groove part can be very easily formed and at the same time, the stacked piezoelectric element (stacked body) can be free from damaging at the formation of groove parts.

In this way, according to the present invention, a method for producing a stacked piezoelectric element, where groove parts can be easily formed on the side face of a stacked body without causing damages, can be provided.

DETAILED DESCRIPTION

Figure 1:
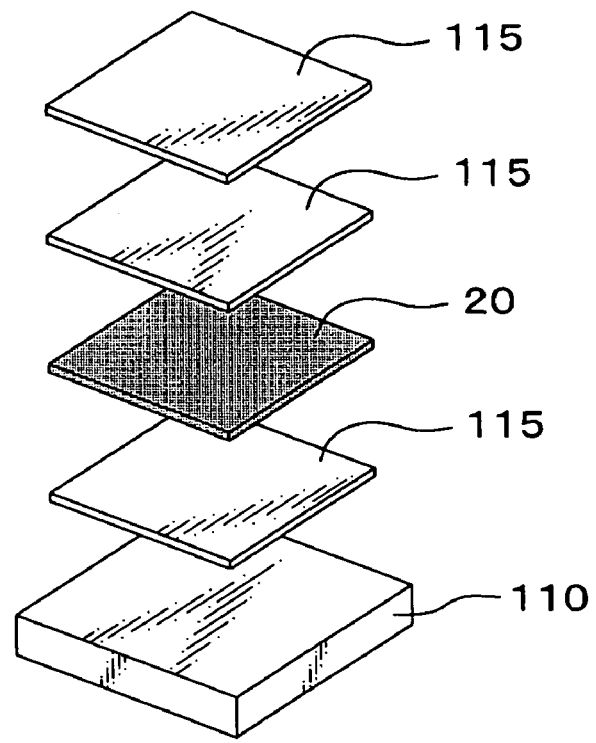
FIG. 1 is a developed explanatory view showing the constitution of the unit body in Example 1.

In the unit body formation step, the narrow stacked part may take a constitution where an electrode material layer is disposed directly on the green sheet for a base and one or more narrow piezoelectric layers are stacked thereon, a constitution where one or more narrow piezoelectric material layers are stacked directly on the green sheet for a base and an electrode material layer is disposed thereon, or a constitution where an electrode material layer is disposed between a plurality of narrow piezoelectric material layers.

In the unit body formation step, the unit body can also be formed by interposing the narrow stacked part between two green sheets for base.

In the unit body, the narrow stacked part is preferably provided to recede inward from the outer peripheral edge of the green sheet for a base around the entire circumference thereof. In this case, the groove part can be annularly formed around the entire circumference of the stacked piezoelectric element. The narrow stacked part may be of course provided such that a part of the outer peripheral edge thereof is flush with a part of the outer peripheral edge of the green sheet for a base. In this case, the groove part is not formed in the flush portion.

As for the piezoelectric layer of the stacked piezoelectric element, a piezoelectric material such as lead zirconate titanate (PZT) can be used.

As for the inner electrode layer, an Ag—Pd material is preferred in view of durability, and Cu or an alloy material thereof is preferred in view of cost.

In the present invention, a side electrode disposition step of disposing side electrodes on two side faces of the stacked piezoelectric element, namely, on a first side face part and a second side face part, is preferably performed after the firing step. The side electrode can be disposed by various methods. For example, in the groove parts on each of these first side face and second side face, an insulating material and an electrically conducting material are alternately filled along the stacking direction. On each of these first and second side faces, an electrically conducting material is further applied and through this electrically conducting material, respective side electrodes are disposed. In this case, although the groove parts are provided, an alternate electrical conduction structure between the side electrode and the inner electrode layer can be easily formed by alternately filling the insulting material and the electrically conducting material in the groove parts.

Also, a resin coating step of coating the entire side face of the stacked piezoelectric element, including a part of each side electrode, with an insulating resin is preferably performed. By this resin coating, even when the inner electrode layer is exposed to a side face where the side electrode is not provided, this can be covered with the insulating resin and therefore, excellent insulation can be obtained. In the present invention, particularly, by virtue of the presence of groove parts, the insulating resin material intruded into this groove part exerts a so-called anchor effect and the coating state can be more stabilized than in conventional techniques, whereby the durability of the stacked piezoelectric element can be enhanced.

Also, in the unit body formation step, it is preferred to dispose a plurality of narrow stacked parts on one green sheet for a base while leaving a gap between respective narrow stacked parts and cut and separate the green sheet for a base along the gaps to form unit bodies. In this case, a large number of unit bodies can be efficiently produced. Furthermore, for example, a method comprising providing many narrow stacked parts on a wide sheet- or belt-like green sheet for a base, sequentially cutting and separating these by stamping to form unit bodies, and at the same time, stacking the unit bodies, may also be employed. In this case, the unit body formation step and the stacked body formation step can be made to proceed in parallel and the production process can be streamlined.

Each narrow piezoelectric material layer and each electrode material layer are preferably formed by using a slurry- or paste-like raw material and printing it. In this case, the area of each of the narrow piezoelectric material layer and the electrode material layer can be controlled with good precision and at the same time, the thickness of each layer can be easily controlled by the number of printing operations.

It is preferred that, at the formation of the narrow stacked part, at least an uppermost layer is formed by printing and kept in the tacky state without drying and at the subsequent stacking of the unit body, the uppermost layer is used as an adhesive layer. In this case, by only stacking the unit body on the uppermost layer, a plurality of unit bodies can be integrated due to tackiness of the uppermost layer of the narrow stacked part and the stacked body can be easily formed.

This is also very effective in the case of using the above-described method of providing many narrow stacked parts on a wide sheet- or belt-like green sheet for a base, sequentially punching out these to form unit bodies and at the same time, stacking the unit bodies, because the unit bodies are sequentially bonded.

Furthermore, it is preferred that in the unit body formation step, the narrow stacked part is formed such that the electrode material layer comes into direct contact with the green sheet for a base, wherein a takeout electrode part is formed in the electrode material layer by extending a part of the outer periphery of the electrode material layer to the position nearly flush with the outer peripheral end face of the green sheet for a base constituting the unit body.

In this case, by virtue of the presence of a takeout electrode part, electrical connection between the side electrode disposed on the side face of the stacked body and the inner electrode layer can be relatively easily attained.

EXAMPLES

The method for producing a stacked piezoelectric element of the present invention is described below by referring to FIGS. 1 to 11.

Figure 5:
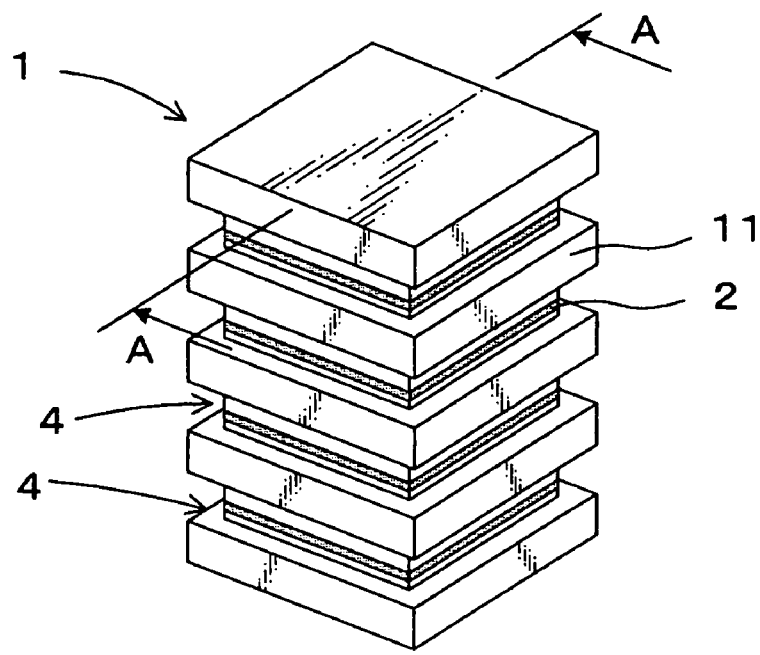
FIG. 5 is a perspective view of the stacked piezoelectric element in Example 1.
Figure 6:
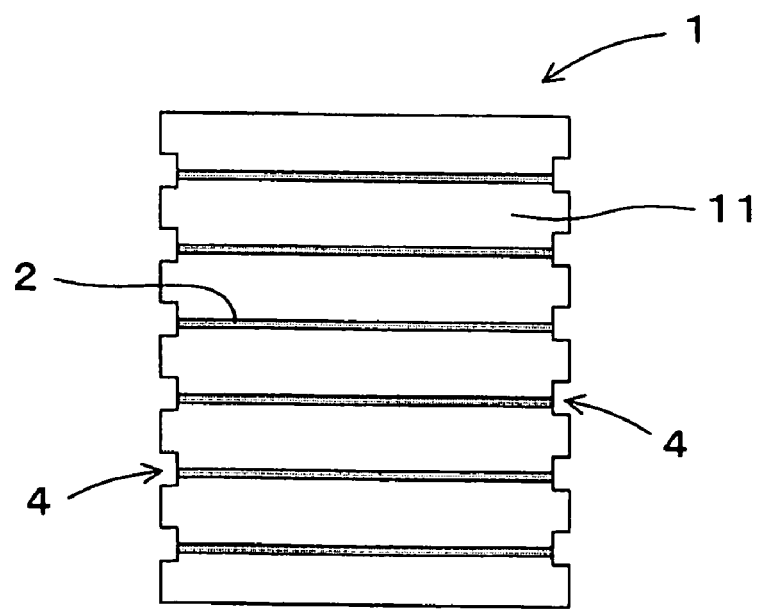
FIG. 6 is a cross-sectional view cut along the line A—A of FIG. 5 in Example 1.

As shown in FIGS. 5 and 6, the stacked piezoelectric element 1 produced in this Example is a stacked piezoelectric element obtained by alternately stacking a piezoelectric layer 11 comprising a piezoelectric material and an inner electrode layer 2 comprising an electrically conducting material.

In producing this stacked piezoelectric element 1, as shown in FIGS. 1 to 6, at least a green sheet production step, a unit body formation step, a stacked body formation step and a firing step, which are described below, are performed.

The green sheet production step is a step of producing a green sheet 110 for base (FIG. 1), which constitutes a part of the piezoelectric layer 11.

Figure 2:
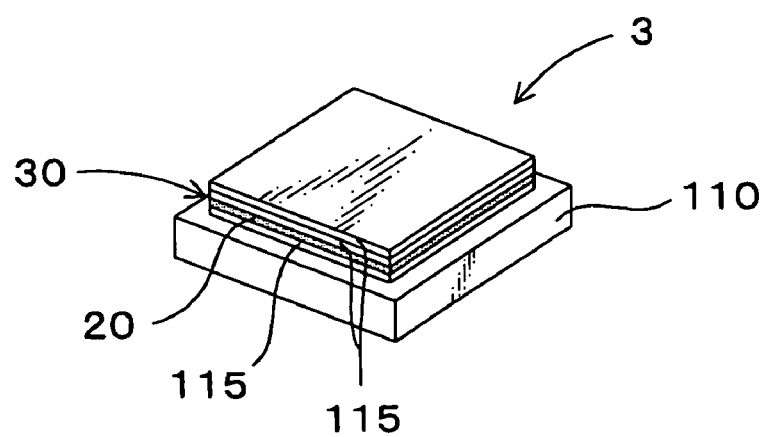
FIG. 2 is a perspective view showing the unit body in Example 1.

The unit body formation step is, as shown in FIGS. 1 and 2, a step of forming a unit body 3 by disposing a narrow stacked part 30 on the green sheet 110 for base, wherein the narrow stacked part 30 is formed by stacking a narrow piezoelectric material layer 115, which constitutes a part of the piezoelectric layer 11, having an area smaller than the green sheet 110 for base and an electrode material layer 20, which constitutes the inner electrode layer, having an area smaller than the green sheet 110 for base.

Figure 3:
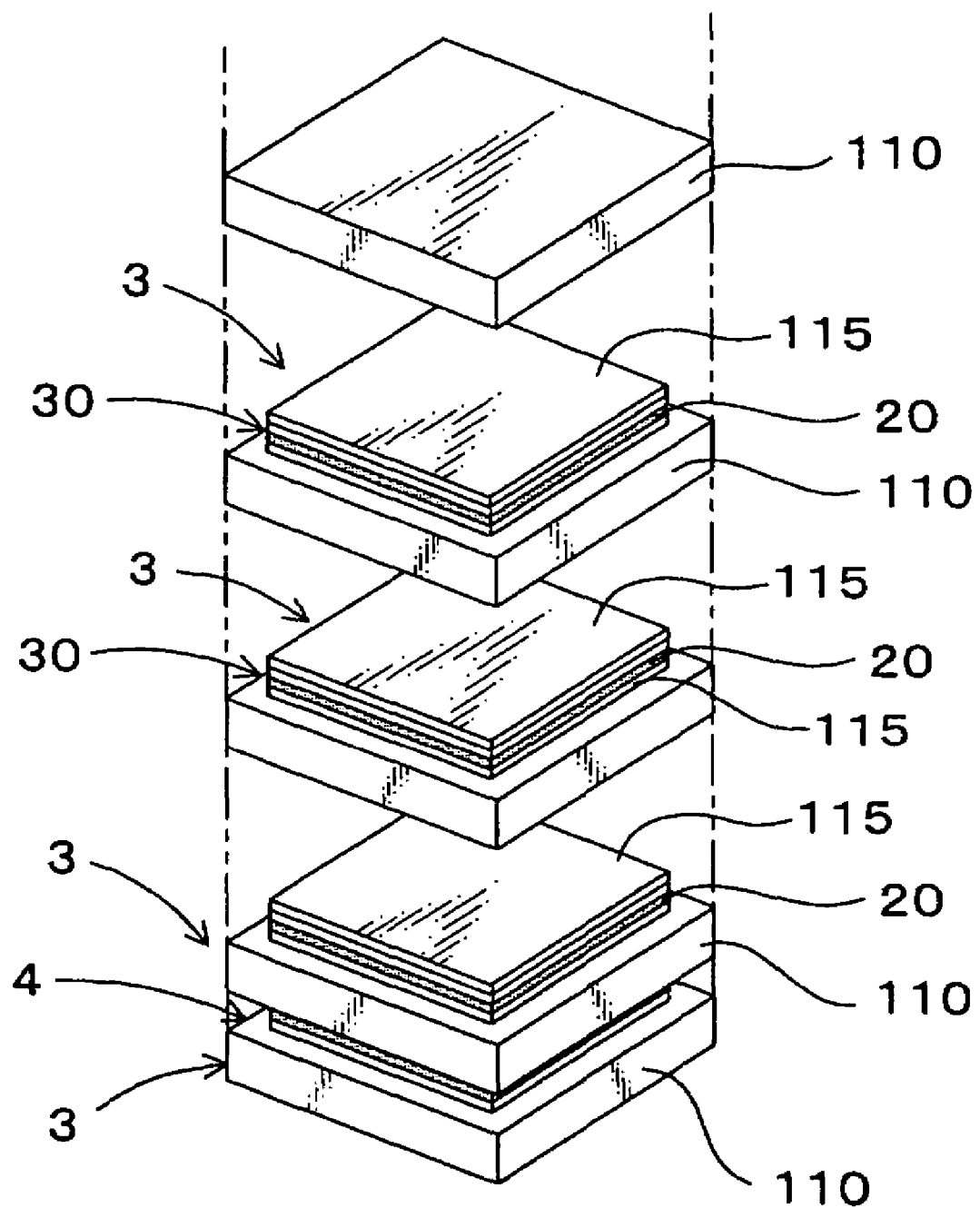
FIG. 3 is an explanatory view showing the method of forming the stacked body in Example 1.
Figure 4:
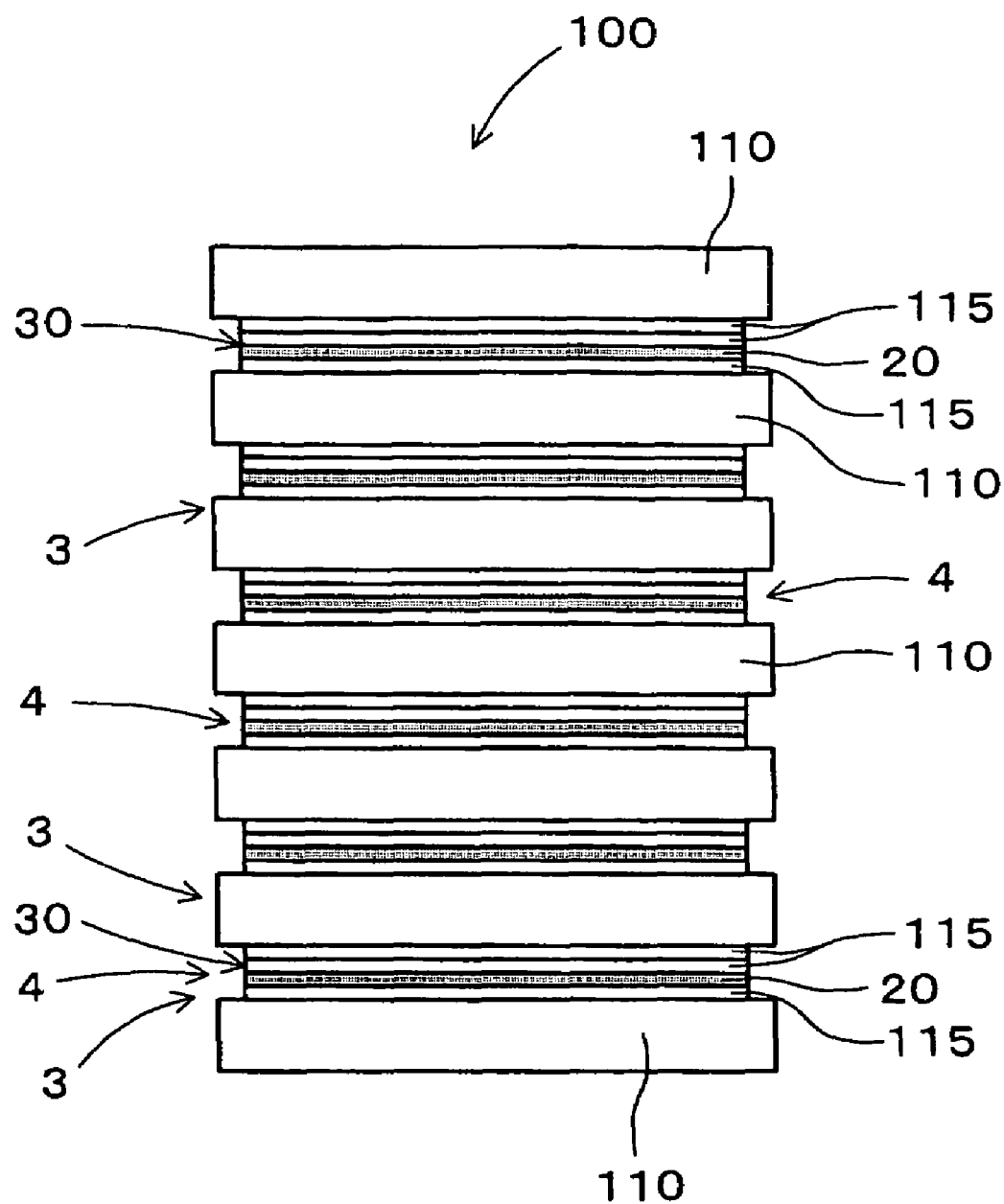
FIG. 4 is an explanatory view when viewed from a side face of the stacked body in Example 1.

The stacked body formation step is, as shown in FIGS. 3 and 4, a step of forming a stacked body 100 having groove parts 4 by stacking a plurality of the unit bodies 3, wherein the groove part having the bottom being defined by the side face 35 of the narrow stacked part 30.

The firing step is a step of firing the stacked body 100 to produce a stacked piezoelectric element 1.

These steps are described in more detail below.

In this Example, the step for producing a green sheet for a base is performed as follows so as to employ PZT as the piezoelectric layer 11.

Lead oxide, zirconium oxide, titanium oxide, niobium oxide, strontium carbonate and the like each in the powder form, which are main raw materials of the piezoelectric material, are weighed into a desired composition. By taking account of the evaporation of lead, the lead oxide was formulated to be richer by 1 to 2% than the stoichiometric ratio of the above-described mixing ratio. These components are mixed in a dry system by a mixer and then calcined at 800 to 950° C.

Thereafter, pure water and a dispersant are added to the calcined powder and the obtained slurry is wet-ground in a pearl mill. The ground product is dried, powder degreased and after adding thereto a solvent, a binder, a plasticizer, a dispersant and the like, mixed in a ball mill. The resulting slurry is subjected to vacuum defoaming and adjustment of viscosity while stirring with a stirrer in a vacuum device.

This slurry is then shaped into a green sheet of a certain thickness by using a doctor blade device.

The green sheet obtained is stamped by a press or cut by a cutter and thereby shaped into a rectangular form and this is used as a green sheet 110 for base. The green sheet for a base can also be shaped, for example, in the circular, elliptic or barrel form according to the shape of the stacked piezoelectric element to be obtained. Also, as described later, a belt-like or wide sheet-like green sheet for a base can be prepared and afterward cut and separated into a desired shape.

On the surface of the resulting rectangular green sheet 110 for base, in this Example, as shown in FIG. 1, a narrow piezoelectric material layer 115 and an electrode material layer 20 each having an area smaller than the green sheet for a base are disposed by screen printing.

The material used for the narrow piezoelectric material layer 115 is the same slurry as the material of the green sheet 110 for base. The material used for the electrode material layer 20 is a paste comprising silver and palladium (hereinafter referred to as an Ag/Pd paste) at a ratio of silver/palladium=7/3. The material for the electrode material layer 20 may be changed to a material mainly comprising Cu.

In this Example, as shown in FIG. 1, one sheet of the narrow piezoelectric material layer 115 is disposed by screen printing on one green sheet 110 for base and after drying, one sheet of the electrode material layer 20 is disposed thereon by screen printing and then dried. Furthermore, one sheet of the narrow piezoelectric material layer 115 is disposed by screen printing and after drying, one sheet of the narrow piezoelectric material layer 115 is further printed thereon. The narrow piezoelectric material layer 115 as the uppermost layer is kept in the tacky state without drying and used as an adhesive layer at the subsequent stacking of a unit body 3.

Thus, as shown in FIG. 2, a narrow stacked part 30 is formed on one green sheet 110 for base by stacking the narrow piezoelectric material layer 115 and the electrode material layer 20. In this way, a unit body 3 where a narrow stacked part 30 is disposed on a green sheet 3 for base is formed. In this Example, as shown in the FIG. 2, the unit body 3 is constituted in such a state that the entire outer peripheral edge of the narrow stacked part 30 is receding inward from the outer peripheral edge of the green sheet 110 for base.

Thereafter, a stacked body formation step of, as shown in FIG. 3, stacking a plurality of unit bodies 3 obtained above and further stacking on the uppermost layer thereof one separately prepared green sheet 110 for base is performed. In this way, as shown in FIG. 4, a stacked body 100 having many groove parts 4 with each bottom being defined by the side face 35 of the narrow stacked part 30 is formed. In this Example, as described above, each unit body 3 is in such a state that the entire outer peripheral edge of the narrow staked part 30 on the green sheet 110 for base is receding from the outer peripheral edge of the green sheet 110 for base. Therefore, in the stacked body 100, the groove part 4 is formed around the entire circumference thereof.

Then, a firing step of degreasing and then firing the stacked body 100 is performed. The degreasing is performed by holding the stacked body 100 in an electric furnace at a temperature of 400 to 700° C. for a predetermined time. The firing is performed by holding the stacked body 100 at a temperature of 900 to 1,200° C. for a predetermined time. In this way, a stacked piezoelectric element 1 of this Example where, as shown in FIGS. 5 and 6, a piezoelectric layer 11 mainly comprising PZT which is an oxide of Pb(Zr, Ti)O$_3$-based perovskite structure, and an inner electrode layer 2 comprising Ag/Pd are alternately stacked is obtained. Furthermore, in this Example, as shown in FIGS. 7 to 11 which are described later, a layer comprising PZT is joined as a protective layer 16 to both end faces in the stacking direction of the stacked piezoelectric element 1.

Figure 7:
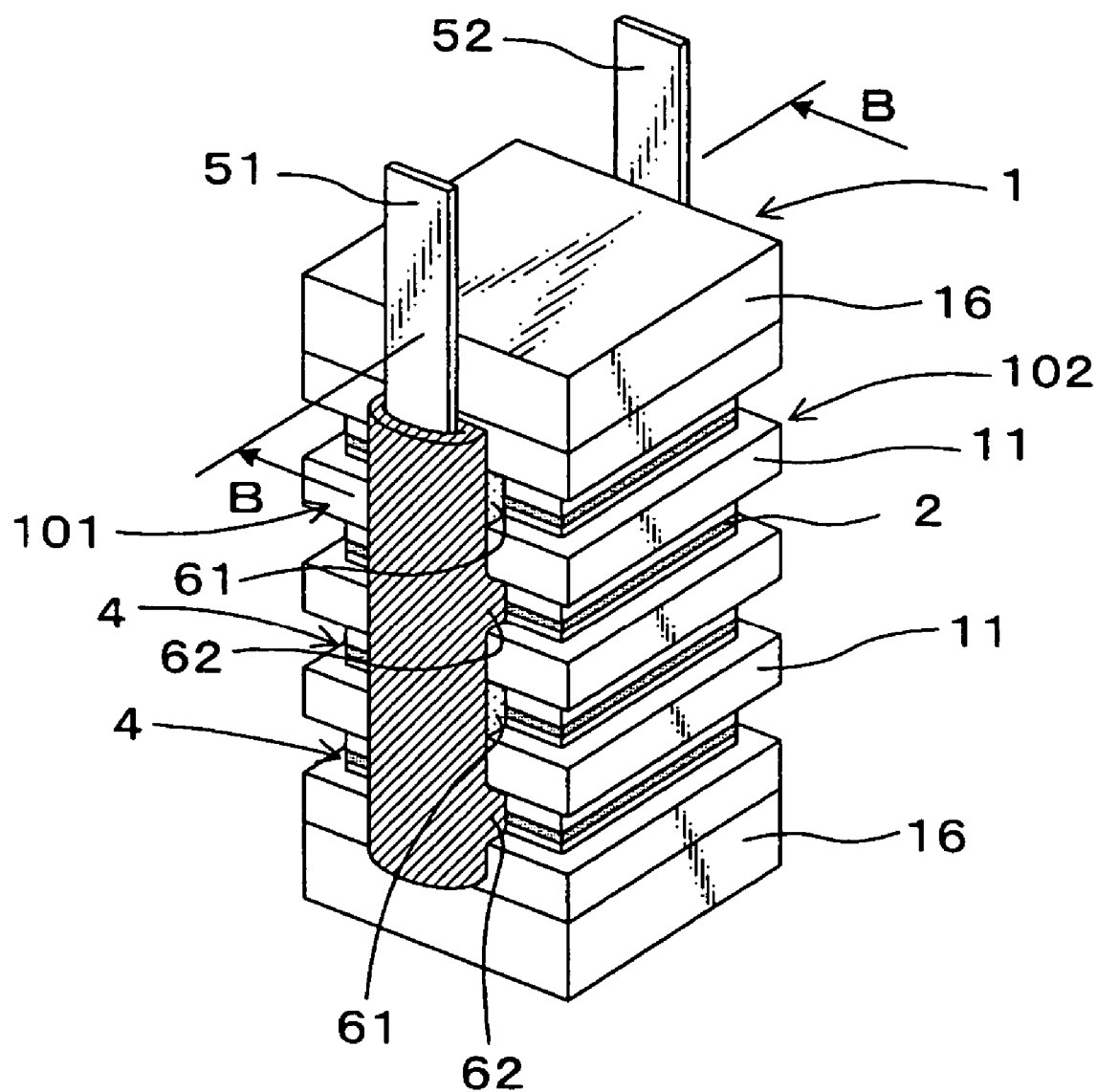
FIG. 7 is a perspective view showing the state where side electrodes are disposed on side faces of the stacked piezoelectric element in Example 1.
Figure 8:
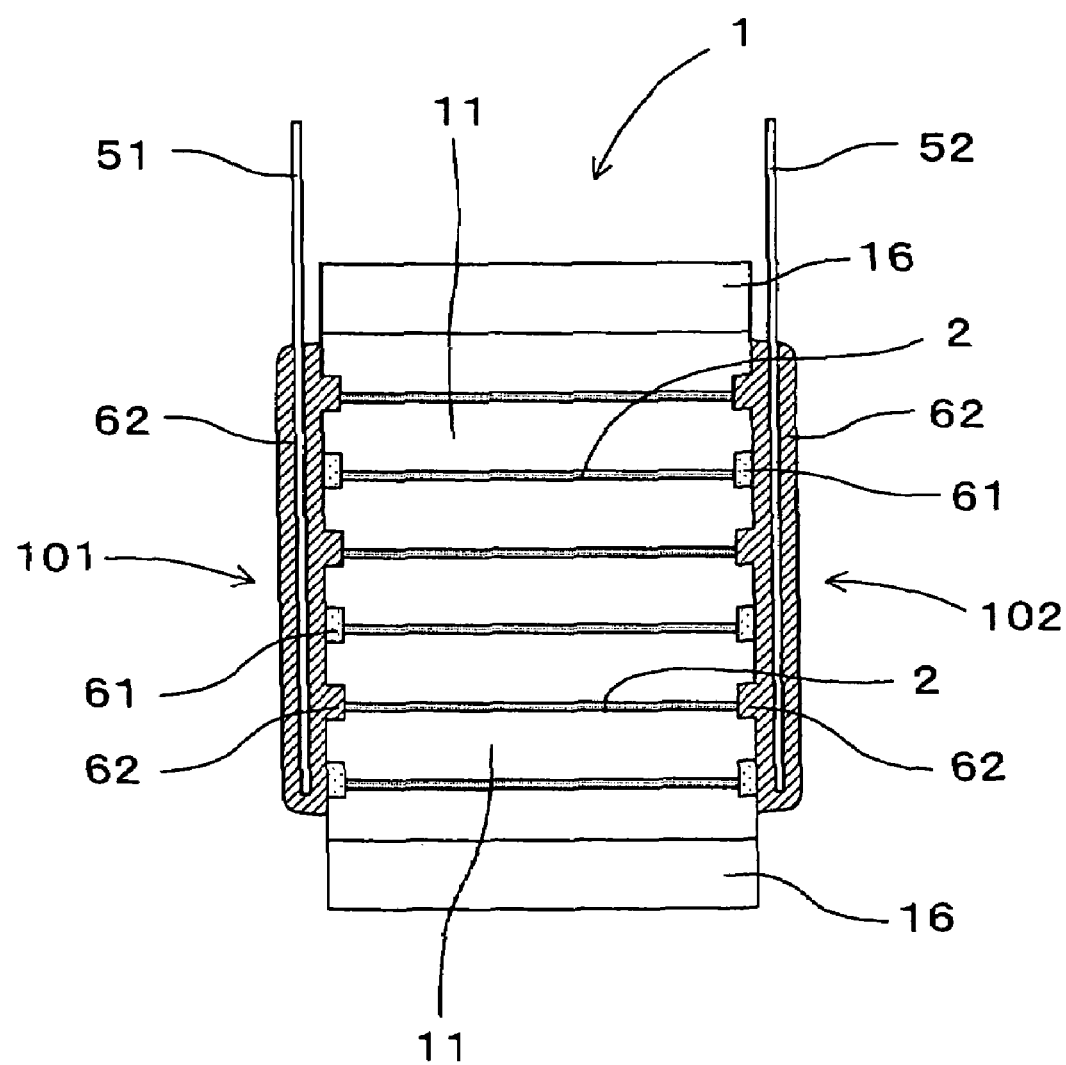
FIG. 8 is a cross-sectional view cut along the line B—B of FIG. 7 in Example 1.

Subsequently, in this Example, as shown in FIGS. 7 and 8, a side electrode disposition step of disposing side electrodes 51 and 52 on two side faces 101 and 102 of the stacked piezoelectric element 1 is performed.

In this Example, as shown in the Figures, an insulating material 61 and an electrically conducting material 62 are alternately filled in the groove parts 4 on each of the first side face 101 and the second side face 102 along the stacking direction. On each of the first side face 101 and the second side face 102, an electrically conducting material 62 is further applied and through this electrically conducting material, respective side electrodes 51 and 52 are disposed. In this Example, an electrically conducting adhesive comprising silver-palladium (Ag—Pd) is used as the electrically conducting material 62 and a silicon resin is used as the insulating material 61.

Figure 9:
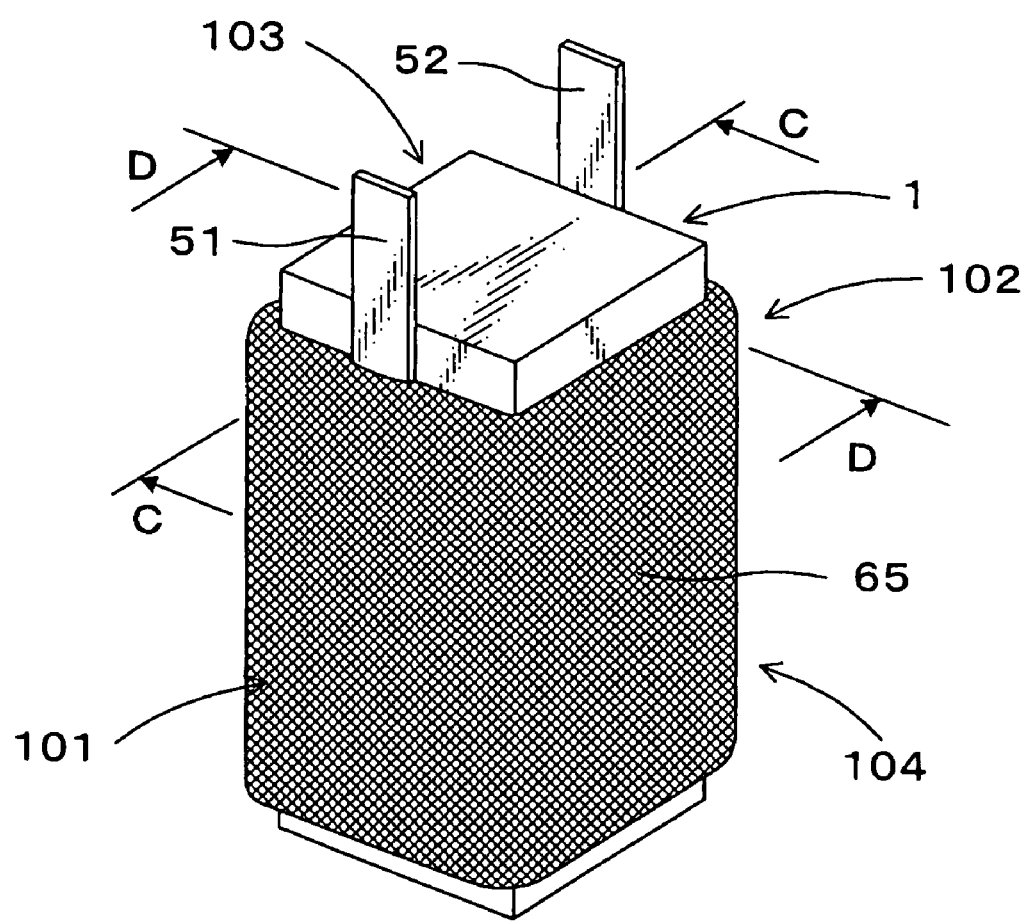
FIG. 9 is an explanatory view showing the state where the entire side face of the stacked piezoelectric device is coated with an insulating resin material in Example 1.
Figure 10:
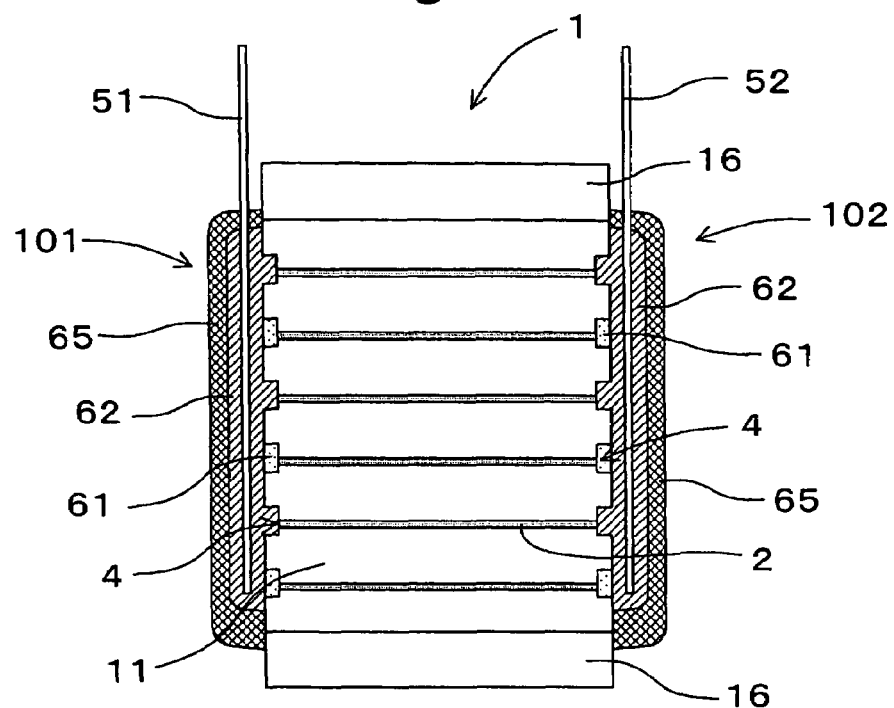
FIG. 10 is a cross-sectional view cut along the line C—C of FIG. 9 in Example 1.
Figure 11:
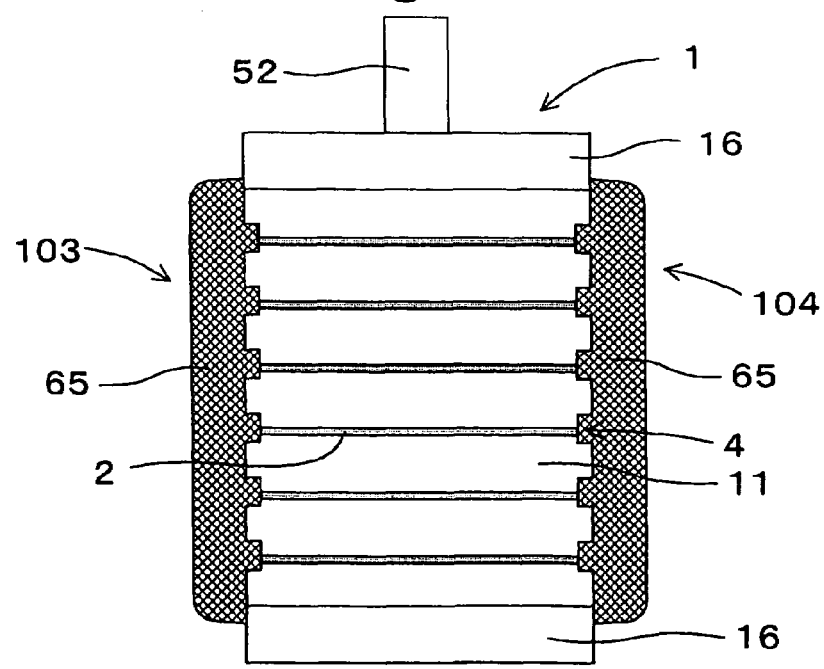
FIG. 11 is a cross-sectional view cut along the line D—D of FIG. 9 in Example 1.

Furthermore, in this Example, a resin coating step of, as shown in FIGS. 9 to 11, coating the entire side face of the stacked piezoelectric element 1, including a part of each side electrode 51 or 52, with an insulating resin 65 is performed. By this resin coating, as shown in FIG. 11, even when the inner electrode layer 2 is exposed to a side face 103 or 104 where the side electrode 51 or 52 is not provided, this can be covered with the insulating resin 65 and, therefore, excellent insulation can be obtained. In addition, as shown in FIG. 11, by virtue of the presence of groove parts 4, the insulating resin material 65 intruded into this groove part 4 exerts a so-called anchor effect and the coating state can be more stabilized than in conventional techniques, whereby the durability of the obtained stacked piezoelectric element 1 can be enhanced.

Furthermore, in this Example, in providing many groove parts 4 on the side face of the stacked piezoelectric element 1, this can be attained by only forming a unit body 3 having the above-described structure and stacking the unit bodies, and a specific machining operation conventionally required for forming groove parts, such as cutting work by a cutting saw, is not necessary, so that the groove part 4 can be very easily formed and at the same time, the stacked piezoelectric element 1 can be free from damage at the formation of groove parts 4.

Example 2

In this Example, as shown in FIGS. 12 to 15, the shape of the inner electrode layer 2 exposed to the groove part 4 of the stacked piezoelectric element 1 is alternately changed.

Figure 12:
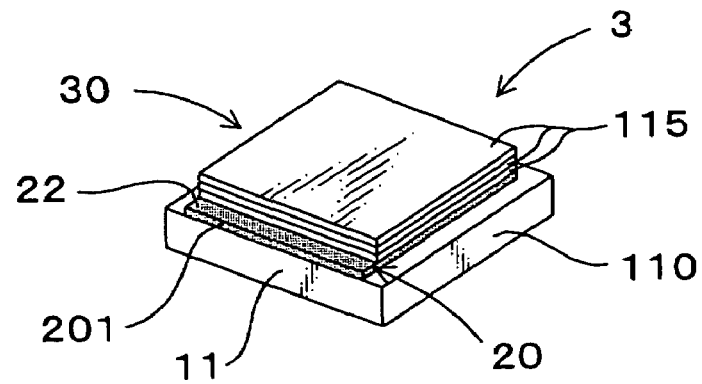
FIG. 12 is a perspective view showing the unit body in Example 2.

More specifically, in the unit body formation step of this Example, as shown in FIG. 12, the narrow stacked part 30 is formed such that the electrode material layer 20 comes into direct contact with the green sheet 110 for base. Then, a takeout electrode part 22 is formed in the electrode material layer 20 by extending a part (one side part 201) of the outer periphery of the electrode material layer to the position nearly flush with the outer peripheral end face 111 of the green sheet 110 for base constituting the unit body 3.

Figure 13:
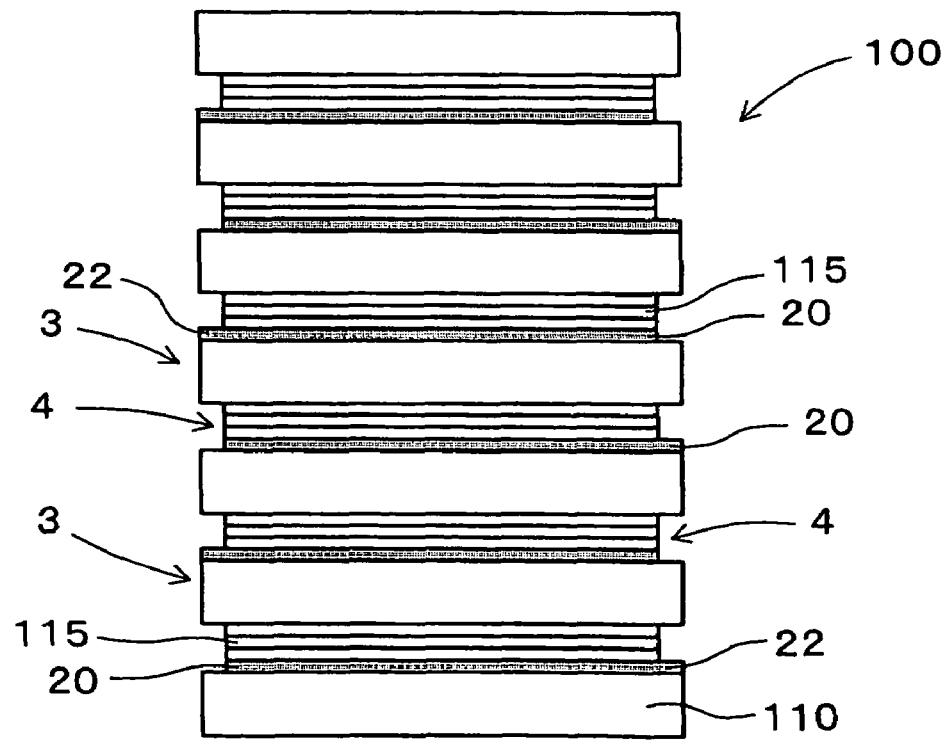
FIG. 13 is an explanatory view when viewed from a side face of the stacked body in Example 2.

In the stacked body formation step, a stacked body 100 is obtained, as shown in FIG. 13, by stacking the unit bodies 3 such that the takeout electrode parts 22 appear alternately on the right and left.

Figure 14:
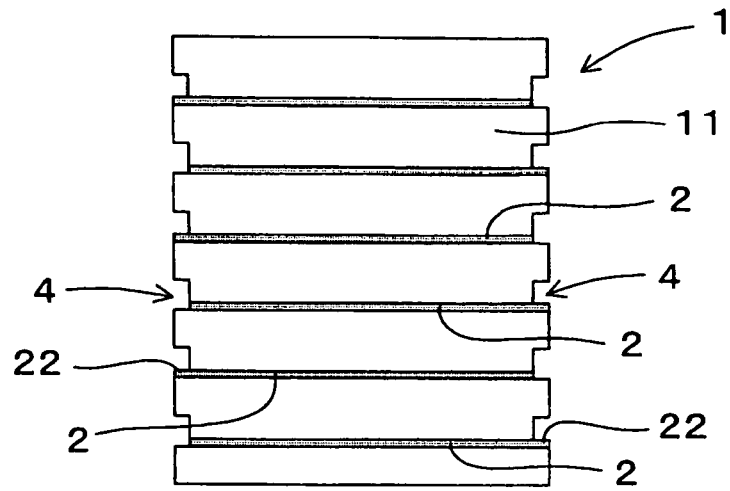
FIG. 14 is an explanatory view showing the cross-section of the stacked piezoelectric element in Example 2.

Thereafter, the firing step is performed in the same manner as in Example 1, whereby a stacked piezoelectric element 1 where, as shown in FIG. 14, a piezoelectric layer 11 and an inner electrode layer 2 are alternately stacked, is obtained.

Also, in this Example, a side electrode disposition step is performed in the same manner as in Example 1.

Figure 15:
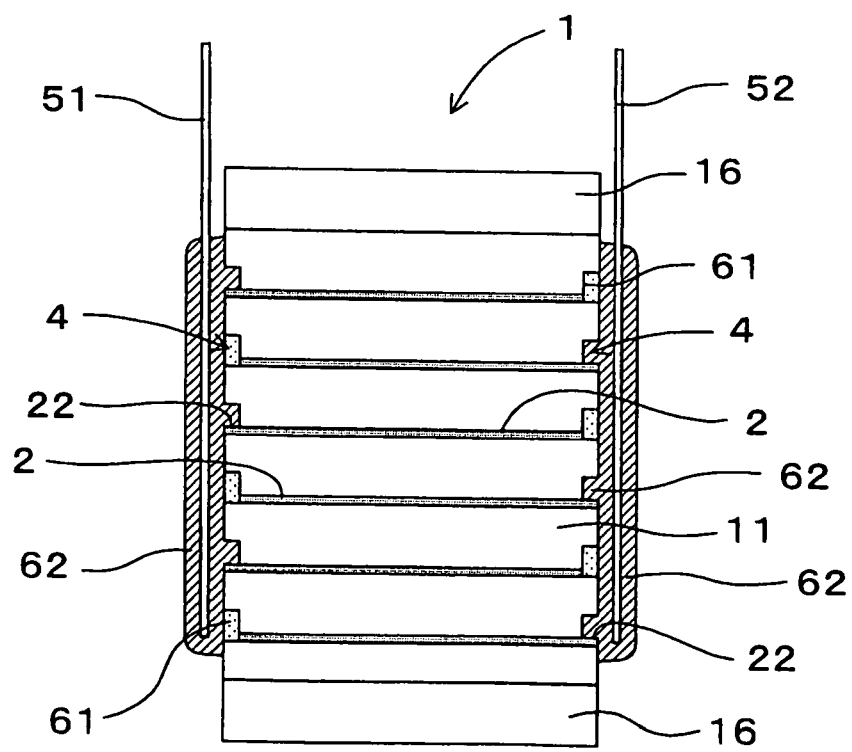
FIG. 15 is a cross-sectional view showing the state where side electrodes are disposed on side faces of the stacked piezoelectric element in Example 2.

By this disposition, as shown in FIG. 15, the area where the electrically conducting material 62 filled in the groove part 4 is contacting with the takeout electrode part 22 is more increased than in Example 1 and the electrical connection state can be enhanced.

In addition, the same operational effects as in Example 1 can be obtained.

Example 3

Figure 16:
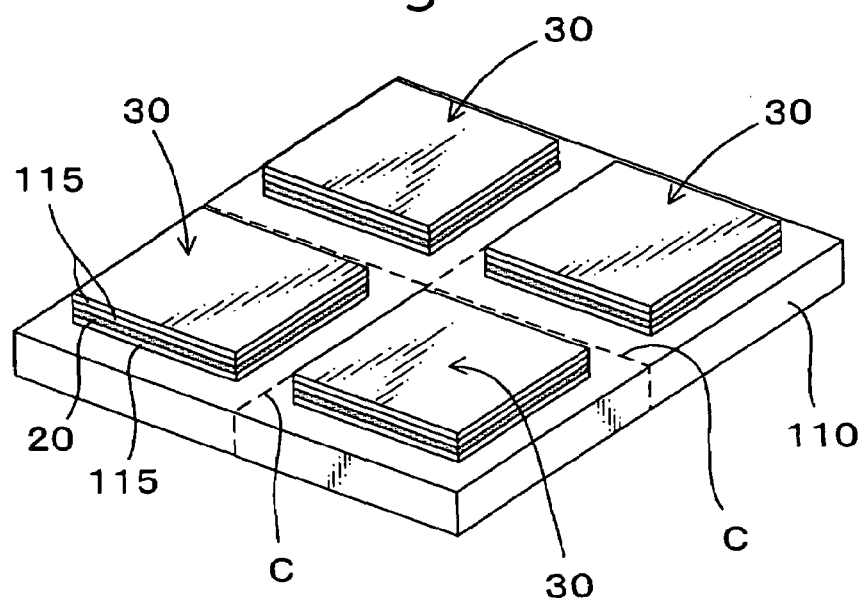
FIG. 16 is an explanatory view showing the state where a plurality of narrow stacked parts are disposed on a wide sheet-like green sheet for a base in Example 3.

In the unit body formation step of this Example, as shown in FIG. 16, a unit body 3 is formed by disposing a plurality of narrow stacked parts 30 on one wide sheet-like green sheet for a base while leaving a gap between respective narrow stacked parts and cutting and separating the green sheet 110 for base along the gaps.

More specifically, as shown in the Figure, a narrow piezoelectric material layer 115 and an electrode material 20 are disposed on one wide sheet-like green sheet 110 for base by printing in the same manner as in Example 1 to form a plurality of narrow stacked parts 30.

Thereafter, the green sheet 110 for base is cut and separated along the cutting line (broken line C), whereby a plurality of unit bodies 3 (FIG. 2) can be obtained from one green sheet 110 for base.

In this case, the production of unit body 3 can be more efficiently performed. In addition, the same operational effects as in Example 1 can be obtained.

Example 4

Figure 17:
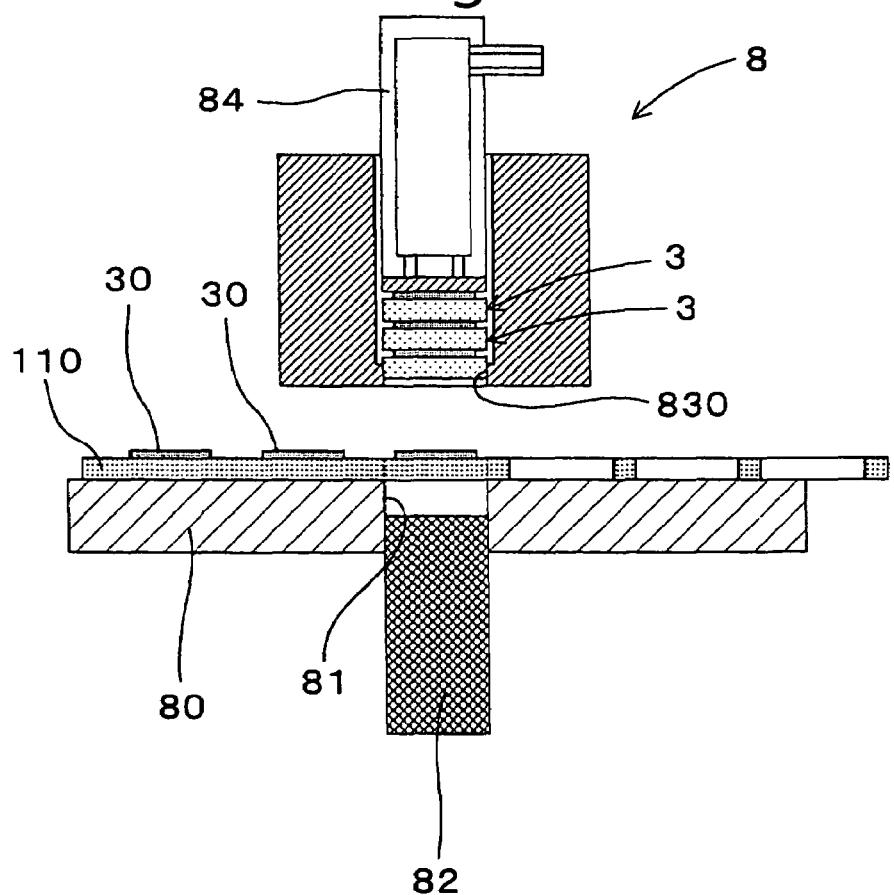
FIG. 17 is an explanatory view showing the constitution of the stamping device in Example 4.

In this Example, a method of, as shown in FIG. 17, providing many narrow stacked parts 30 on a belt-like green sheet 110 for base, sequentially cutting and separating them by stamping to form unit bodies 3 and, at the same time, sequentially stacking the unit bodies to form a stacked body, is employed.

More specifically, a belt-like green sheet 110 for base is produced in the same manner as in Example 1, many narrow stacked parts 30 are formed by printing on the top face of the green sheet and then, as shown in FIG. 17, the unit bodies 3 are stamped and stacked by a stamping device 8.

The stamping device 8 comprises, as shown in the FIG. 17, at least a cushion part 80 for supporting the green sheet 110 for base, a punch 82 disposed ascentably via a through hole 81 provided in the cushion part, and an upper die 83 having a die hole 830 opposite to the punch 82. In the die hole 830 of the upper die 83, an adsorbing and weight-adding holder 84 is vertically movably disposed. This adsorbing and weight-adding holder 84 has a function of adsorbing a stamped unit body 3 by a suction force and adding an appropriate weight to stacked multiple unit bodies 3 and is constituted to vertically move according to the number of unit bodies stamped.

The punch 82 of the stamping device 8 is thrust up every at advance of the green sheet 110 for base, whereby unit bodies 3 can be stamped and stacked.

In this Example, the unit body formation step and the stacking step can be made to simultaneously proceed by continuous stamping with the use of the stamping device 8 and therefore, the production efficiency can be more enhanced.

In addition, the same operational effects as in Example 1 can be obtained.

Example 5

Figure 18:
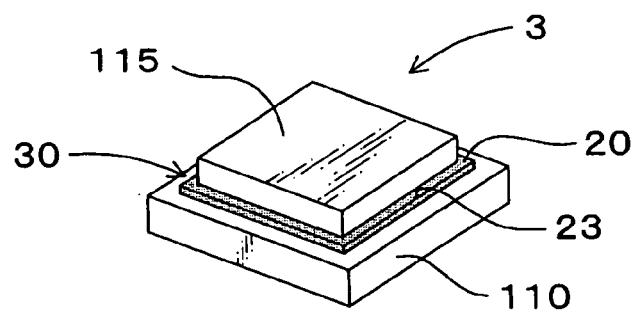
FIG. 18 is a perspective view showing the unit body in Example 5.
Figure 19:
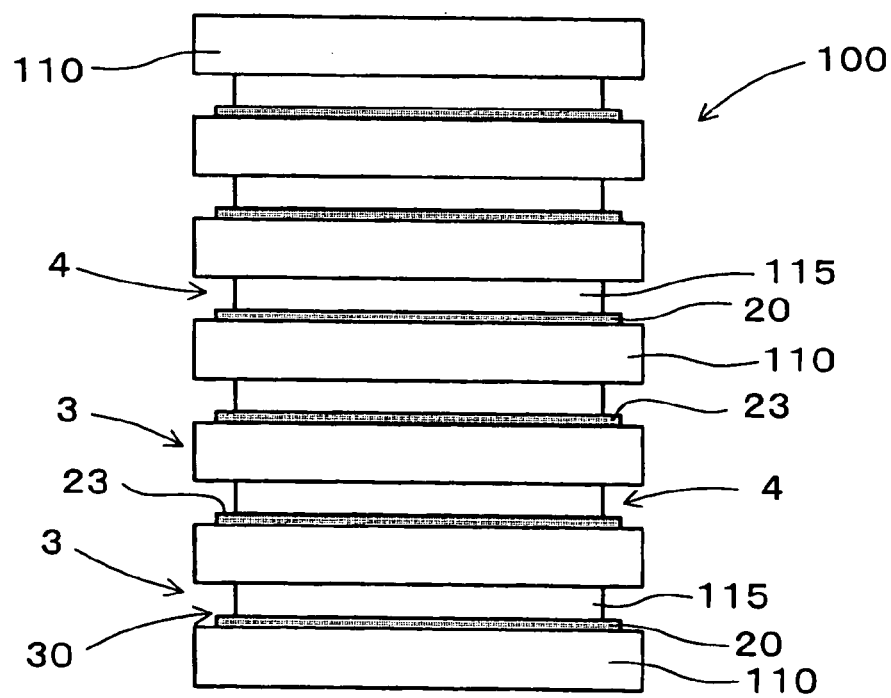
FIG. 19 is an explanatory view when viewed from a side face of the stacked body in Example 5.
Figure 20:
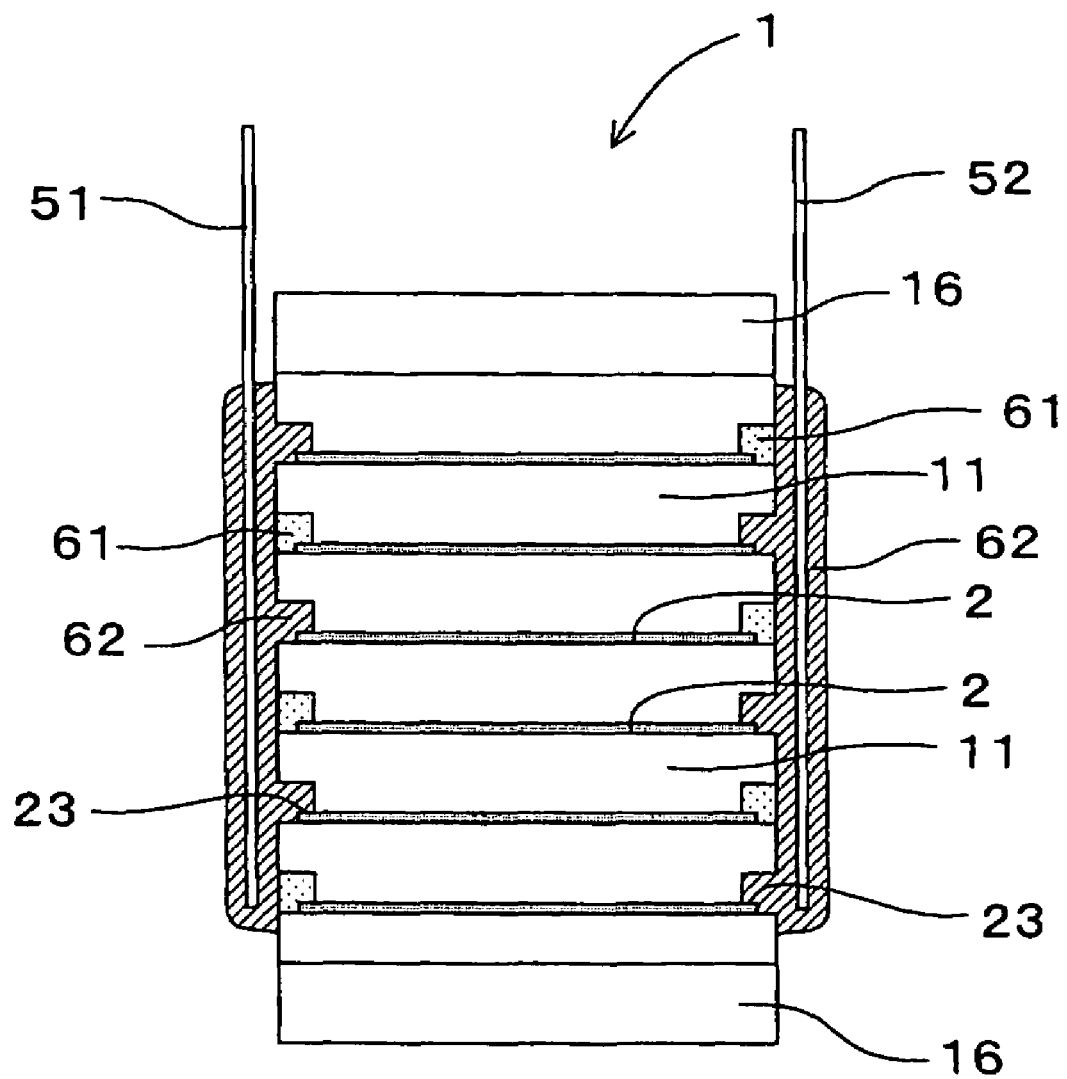
FIG. 20 is a cross-sectional view showing the state where side electrodes are disposed on side faces of the stacked piezoelectric element in Example 5.

In this Example, as shown in FIGS. 18 to 20, the shape of the inner electrode layer 2 exposed to the groove part 4 of the stacked piezoelectric element 1 is changed to a shape different from that in Example 1.

More specifically, in the unit body formation step of this Example, as shown in FIG. 18, the electrode material 20 is formed by printing on the green sheet 110 for base and further thereon, a separately prepared narrow piezoelectric material layer 115 constituted by a green sheet is disposed. In this Example, the area of the narrow piezoelectric material layer 115 is made smaller than that of the electrode material layer 20 and therefore, the shape of the obtained unit body 3 becomes such that, as shown in the FIG. 18, the entire outer peripheral edge of the electrode material layer 20 is receding inward from the outer peripheral edge of the green sheet 110 for base and the entire outer peripheral edge of the narrow piezoelectric material layer 115 is further receding inward from the outer peripheral edge of the electrode material layer 20.

Thereafter, as shown in FIG. 19, the unit bodies 3 are stacked to fabricate a stacked body 100, whereby a structure having a step part 23 resulting from the end part of the electrode material layer 20 being present like a step in each groove part 4 is obtained.

Subsequently, the firing step is performed in the same manner as in Example 1 and then side electrodes 51 and 52 are disposed and, as a result, a stacked piezoelectric body 1 as shown in FIG. 20 is obtained.

In this case, an inner electrode layer 2 having a step part 23 is obtained and a side electrode 51 or 52 is connected thereto through an electrically conducting material 62, so that the contact area can be more increased than in Example 1 and the electrical connection structure can be more stabilized.

In addition, the same operational effects as in Example 1 can be obtained.

Example 6

Figure 21:
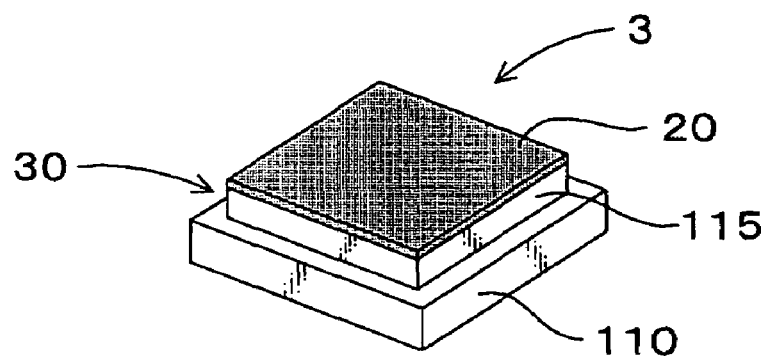
FIG. 21 is a perspective view showing the unit body in Example 6.
Figure 22:
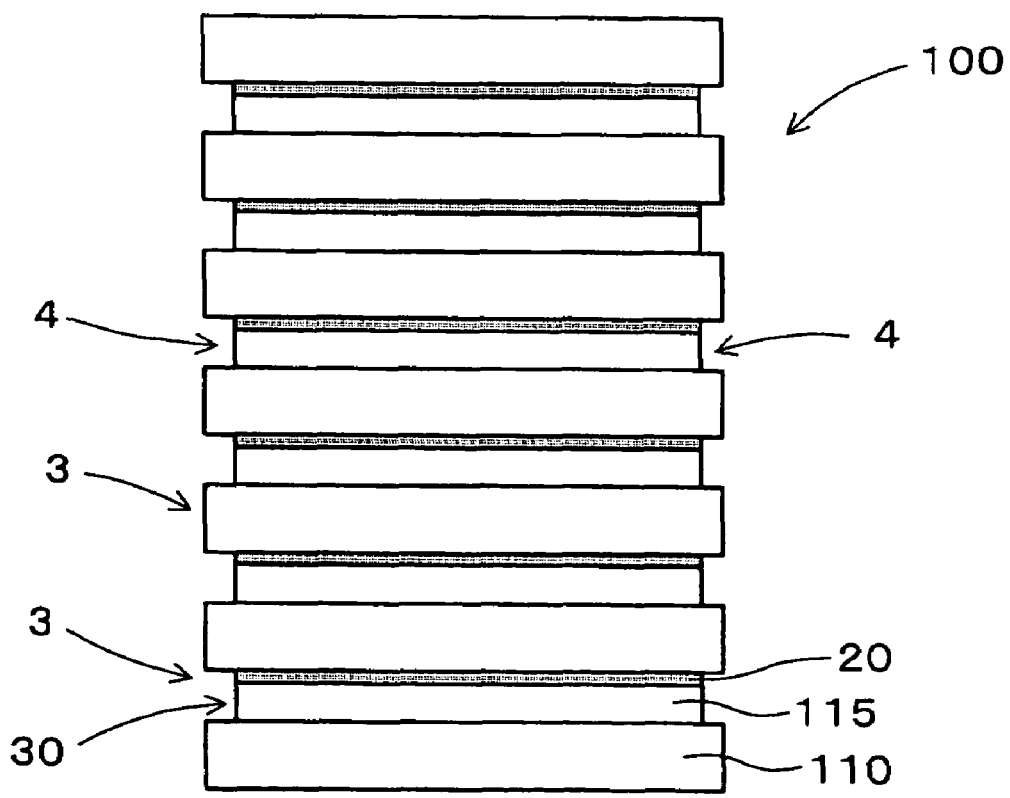
FIG. 22 is an explanatory view when viewed from a side face of the stacked body in Example 6.

In this Example, as shown in FIGS. 21 and 22, the unit body 3 is formed by providing an electrode material layer 20 as an uppermost layer. More specifically, as shown in FIG. 21, a separately prepared narrow piezoelectric material layer 115 constituted by a green sheet is disposed on the green sheet 110 and further thereon, an electrode material layer 20 is formed by printing. In this Example, the area of the narrow piezoelectric material layer 115 and the area of the electrode material layer 20 are made nearly the same.

This example is the same as those in Example 1 except for the above. Also in this case, the same operational effects as in Example 1 can be obtained.

Example 7

In this Example, as shown in FIGS. 23 to 26, the green sheet 110 for base, the narrow piezoelectric material layer 115 and the electrode material layer 20 each has a barrel shape.

Figure 23:
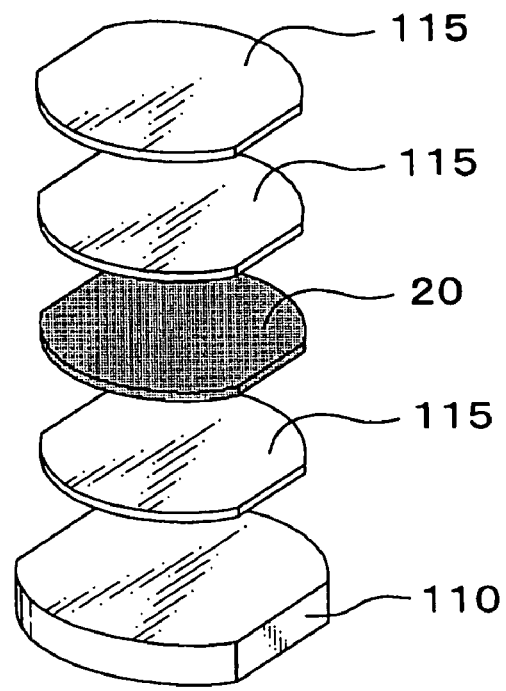
FIG. 23 is a developed explanatory view showing the constitution of the unit body in Example 7.
Figure 24:
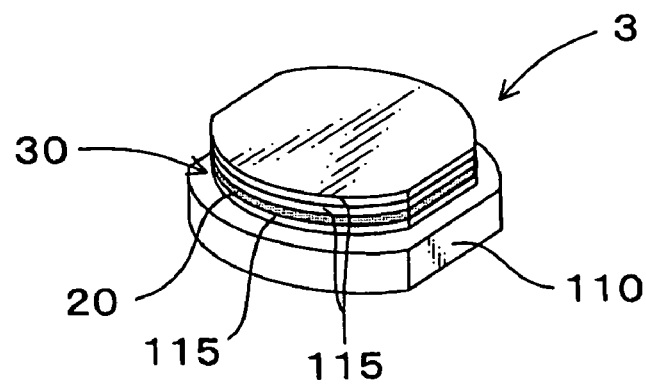
FIG. 24 is a perspective view showing the unit body in Example 7.
Figure 25:
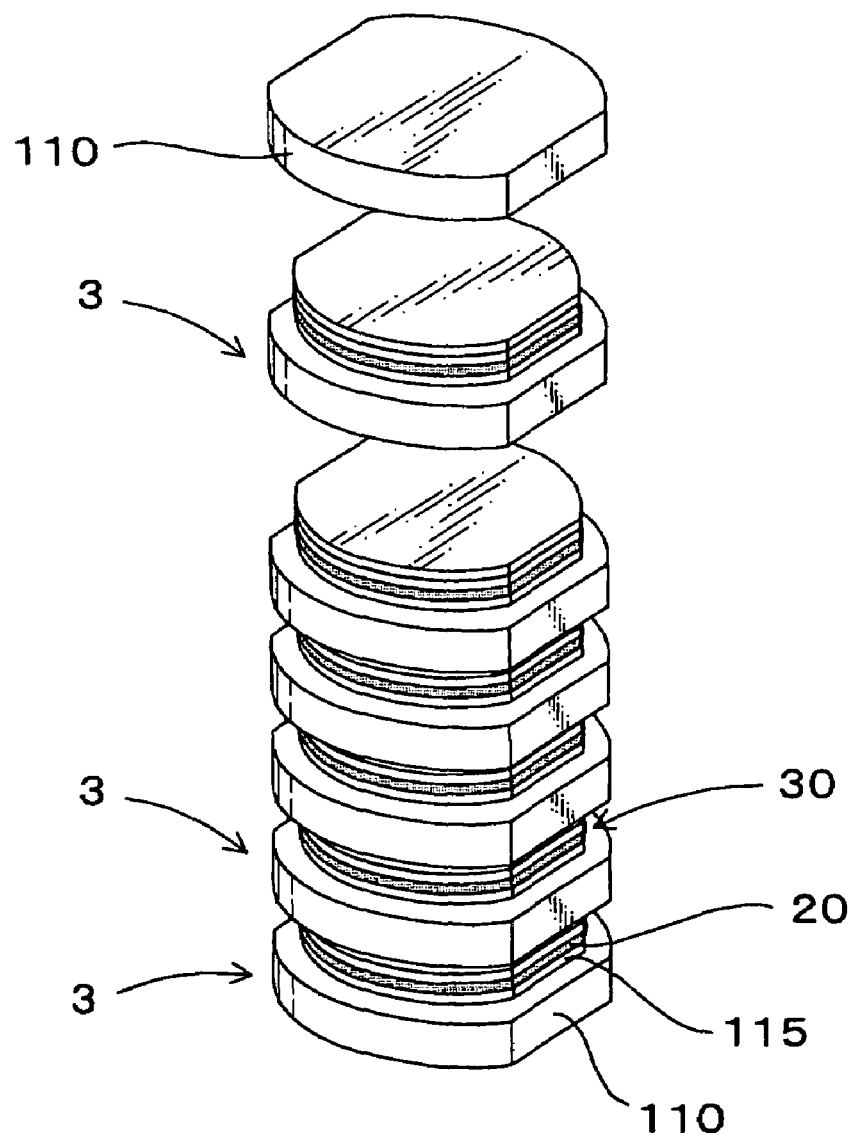
FIG. 25 is an explanatory view showing the method of forming the stacked body in Example 7.
Figure 26:
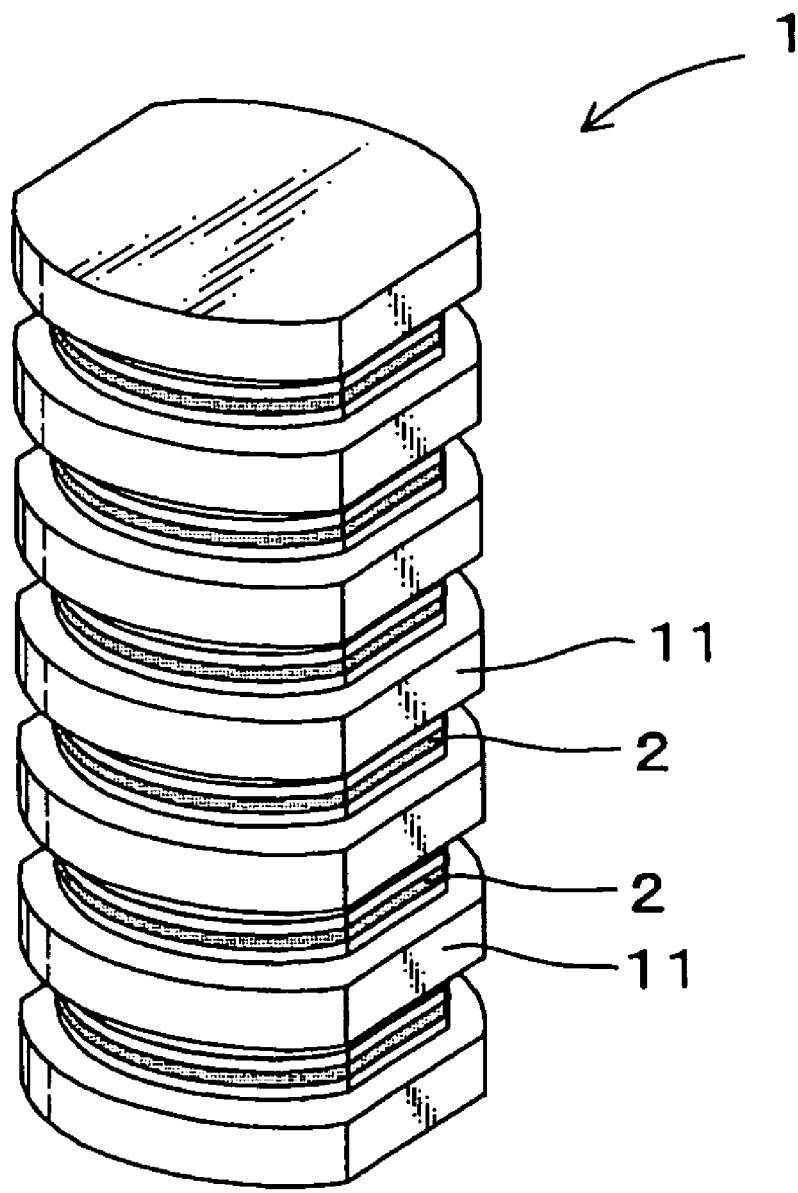
FIG. 26 is a perspective view of the stacked piezoelectric element in Example 7.

More specifically, as shown in FIG. 23, a green sheet stamped into a barrel shape is used for the green sheet 110 for base and thereon, a narrow piezoelectric material layer 115 and an electrode material layer 20 each having a slightly smaller area are formed by printing to provide a narrow stacked part 30. Thereafter, as shown in FIGS. 24 and 25, the unit bodies 3 obtained are stacked and then subjected to the firing step, as a result, a stacked piezoelectric element 1 having, as shown in FIG. 26, a barrel-shaped cross section is obtained.

In this Example, a method of forming a plurality of barrel-shaped narrow stacked parts on a belt- or wide sheet-like green sheet for a base and then obtaining unit bodies 3 by stamping can also be employed.

Also in this Example, the same operational effects as in Example 1 can be obtained.

Example 8

Figure 27:
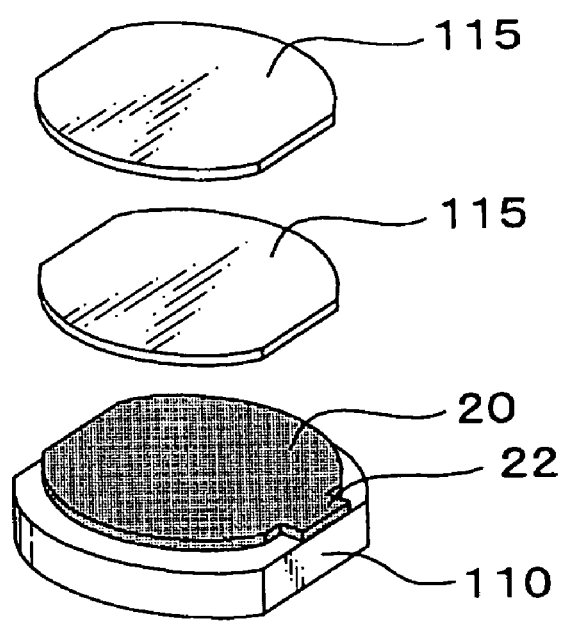
FIG. 27 is a developed explanatory view showing the constitution of the unit body in Example 8.
Figure 28:
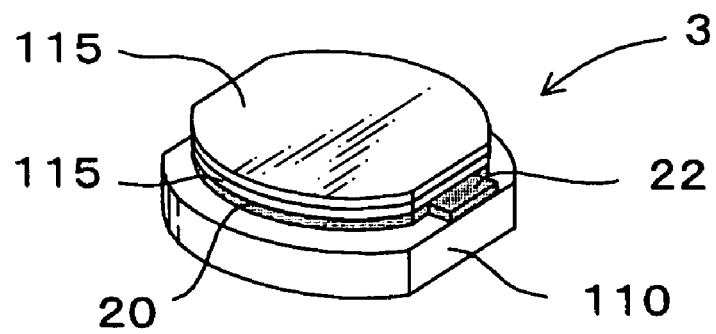
FIG. 28 is a perspective view showing the unit body in Example 8.

In this Example, as shown in FIGS. 27 and 28, a barrel-shaped unit body 3 is formed in the same manner as in Example 7 and in addition, a takeout electrode part 22 is provided in the electrode material layer 20.

More specifically, as shown in FIG. 27, an electrode material layer 20 is formed directly on a barrel-shaped green sheet 110 for base and a takeout electrode part 22 is provided in the electrode material layer 20 by extending a part of the outer periphery of the electrode material layer to the position nearly flush with the outer peripheral end face of the green sheet 110 for base. On the electrode material layer 20, a barrel-shaped narrow piezoelectric material layer 115 is formed by printing, whereby a unit body 3 having a takeout electrode part 22 is obtained.

In the subsequent stacked body formation step, the unit bodies 3 are stacked such that the takeout electrode parts 22 are on opposite sides of the unit bodies. As a result, a stacked body 100 as shown in FIG. 13 is obtained and this is then subjected to the firing step and the like, whereby a stacked piezoelectric element 1 as shown in FIGS. 14 and 15 is obtained.

In addition, the same operational effects as in Example 1 can be obtained.

What is claimed is:

1. A method for producing a stacked piezoelectric element by alternately a stacking piezoelectric layer comprising a piezoelectric material and an inner electrode layer comprising an electrically conducting material, the method comprising:
   a green sheet production step of producing a green sheet for a base, which constitutes a part of the piezoelectric layer,
   a unit body formation step of forming a unit body by disposing a narrow stacked part on the green sheet for a base, wherein the narrow stacked part is comprised of by a narrow piezoelectric material layer which constitutes a part of the piezoelectric layer and has an area smaller than the green sheet for a base and an electrode material layer which constitutes the inner electrode layer and has an area smaller than the green sheet for a base,
   a stacked body formation step of forming a stacked body having groove parts by stacking a plurality of the unit bodies, wherein the groove part having the bottom being defined by the side face of the narrow stacked part, and
   a firing step of firing the stacked body.

2. The method for producing a stacked piezoelectric element according to claim 1, wherein said unit body formation step comprising disposing a plurality of narrow stacked parts on one green sheet for a base while leaving a gap between respective narrow stacked parts, and cutting and separating said green sheet for a base along the gaps to form unit bodies.

3. The method for producing a stacked piezoelectric element according to claim 2, wherein said narrow piezoelectric material layer and said electrode material layer each is formed by using a slurry or paste raw material and printing it.

4. The method for producing a stacked piezoelectric element according to claim 2, wherein at the formation of said narrow stacked part, at least an uppermost layer is formed by printing and kept in the tacky state without drying, and at the subsequent stacking of said unit body, said uppermost layer is used as an adhesive layer.

5. The method for producing a stacked piezoelectric element according to claim 2, wherein in said unit body formation step, said narrow stacked part is formed such that said electrode material layer comes into direct contact with said green sheet for a base, wherein a takeout electrode part is formed in said electrode material layer by extending a part of the outer periphery of the electrode material layer to the position nearly flush with the outer peripheral end face of said green sheet for a base constituting said unit body.

6. The method for producing a stacked piezoelectric element according to claim 1, wherein said narrow piezoelectric material layer and said electrode material layer each is formed by using a slurry or paste raw material and printing it.

7. The method for producing a stacked piezoelectric element according to claim 6, wherein at the formation of said narrow stacked part, at least an uppermost layer is formed by printing and kept in the tacky state without drying, and at the subsequent stacking of said unit body, said uppermost layer is used as an adhesive layer.

8. The method for producing a stacked piezoelectric element according to claim 6, wherein in said unit body formation step, said narrow stacked part is formed such that said electrode material layer comes into direct contact with said green sheet for a base, wherein a takeout electrode part is formed in said electrode material layer by extending a part of the outer periphery of the electrode material layer to the position nearly flush with the outer peripheral end face of said green sheet for a base constituting said unit body.

9. The method for producing a stacked piezoelectric element according to claim 1, wherein at the formation of said narrow stacked part, at least an uppermost layer is formed by printing and kept in the tacky state without drying, and at the subsequent stacking of said unit body, said uppermost layer is used as an adhesive layer.

10. The method for producing a stacked piezoelectric element according to claim 9, wherein in said unit body formation step, said narrow stacked part is formed such that said electrode material layer comes into direct contact with said green sheet for a base, wherein a takeout electrode part is formed in said electrode material layer by extending a part of the outer periphery of the electrode material layer to the position nearly flush with the outer peripheral end face of said green sheet for a base constituting said unit body.

11. The method for producing a stacked piezoelectric element according to claim 1, wherein in said unit body formation step, said narrow stacked part is formed such that said electrode material layer comes into direct contact with said green sheet for a base, wherein a takeout electrode part is formed in said electrode material layer by extending a part of the outer periphery of the electrode material layer to the position nearly flush with the outer peripheral end face of said green sheet for a base constituting said unit body.

* * * * *